United States Patent
Neogi et al.

(10) Patent No.: US 9,108,888 B2
(45) Date of Patent: Aug. 18, 2015

(54) METHOD FOR PRODUCING NANOCRYSTALLINE DIAMOND COATINGS ON GEMSTONES AND OTHER SUBSTRATES

(76) Inventors: Suneeta S. Neogi, Temecula, CA (US); Jayant Neogi, Temecula, CA (US)

( * ) Notice: Subject to any disclaimer, the term of this patent is extended or adjusted under 35 U.S.C. 154(b) by 641 days.

(21) Appl. No.: 12/505,648

(22) Filed: Jul. 20, 2009

(65) Prior Publication Data

US 2010/0068503 A1 Mar. 18, 2010

Related U.S. Application Data

(60) Provisional application No. 61/082,030, filed on Jul. 18, 2008.

(51) Int. Cl.
| | | |
|---|---|---|
| *B32B 5/16* | (2006.01) | |
| *C04B 41/52* | (2006.01) | |
| *C04B 41/00* | (2006.01) | |
| *C04B 41/50* | (2006.01) | |
| *A44C 17/00* | (2006.01) | |
| *A44C 27/00* | (2006.01) | |

(52) U.S. Cl.
CPC .............. *C04B 41/52* (2013.01); *C04B 41/009* (2013.01); *C04B 41/5002* (2013.01); *A44C 17/007* (2013.01); *A44C 27/007* (2013.01); *Y10T 428/25* (2015.01); *Y10T 428/30* (2015.01)

(58) Field of Classification Search
CPC .. C04B 41/009; C04B 41/5002; C04B 41/52; C04B 41/4539; C04B 41/4549; C04B 41/4533; C04B 41/5001; C04B 41/5027; C04B 41/522
See application file for complete search history.

(56) References Cited

U.S. PATENT DOCUMENTS

| 5,814,137 A * | 9/1998 | Blohowiak et al. ........ 106/14.13 |
| 5,853,826 A | 12/1998 | Starcke et al. |
| 6,371,838 B1 * | 4/2002 | Holzapfel ........................ 451/72 |
| 2004/0083759 A1 | 5/2004 | Starcke et al. |
| 2005/0227590 A1 * | 10/2005 | Sung ................................ 451/41 |
| 2006/0182883 A1 | 8/2006 | Neogi et al. |
| 2014/0374670 A1 * | 12/2014 | Mokhtari et al. ............. 252/514 |

FOREIGN PATENT DOCUMENTS

| WO | WO 98/21386 | 5/1998 |
| WO | WO 02/054454 | 7/2002 |

OTHER PUBLICATIONS

International Search Report for International Application No. PCT/US2009/051150 dated Mar. 8, 2010.
International Preliminary Report on Patentability for International Application No. PCT/US2009/051150, Jan. 18, 2011, 1 page.
Written Opinion for International Application No. PCT/US2009/051150, Mar. 8, 2010, 6 pages.

* cited by examiner

*Primary Examiner* — Callie Shosho
*Assistant Examiner* — Cheng Huang
(74) *Attorney, Agent, or Firm* — Patterson Thuente Pedersen, P.A.

(57) ABSTRACT

A method to apply nano-crystalline diamond onto a selected substrate, including preparing Nanodiamond slurry of nano-diamond particles dispersed in a medium. The medium may include a liquid or a sol-gel. The selected substrate is immersed in the Nanodiamond slurry for a predetermined period of time. Then the substrate is removed from the slurry. The substrate is then dried with a flow of inert gas. The substrate is left coated with a coating of the nanodiamond particles that are highly adherently held by van der Waals forces.

10 Claims, 9 Drawing Sheets

METHOD FOR PRODUCING NANOCRYSTALLINE DIAMOND COATINGS ON GEMSTONES AND OTHER SUBSTRATES

CLAIM TO PRIORITY

This application claims the benefit of U.S. Provisional Application Ser. No. 61/082,030, entitled "Method for Producing Nanocrystalline Diamond Coatings on Gemstones and Such" filed Jul. 18, 2008 the entire contents of which are incorporated by reference herein.

FIELD OF THE INVENTION

This invention relates to a process for coating utility and/or decorative objects, with a thin film of nano-crystalline diamond for the purpose of improving the optical and physical characteristics of said objects.

BACKGROUND

Synthetic diamond films and coatings may be grown from the vapor phase using chemical vapor deposition (CVD) such as oxy-acetylene flame combustion CVD, microwave plasma CVD, hot filament CVD etc. Hot filament CVD is one of the oldest and major method of depositing high quality CVD diamond on a large area (Ref: Growth of Diamond by sequential deposition and etching process using hot filament CVD, J. Wei and Y. Tzeng, Journal of Crystal Growth 128, (1993), 413-417). In one form, the deposition of a synthetic diamond film on a substrate using CVD requires an activated gas phase that is activated by high temperature and/or plasma excitation, with the gas phase including a carbon-containing species. Since the gas phase so described will tend to deposit both diamond and graphite on the substrate, the gas phase must also include a species such as atomic hydrogen that preferentially etches graphite. This CVD process also requires a substrate surface receptive to nucleation of diamond thereon and a temperature gradient between the gas phase and the substrate to drive the diamond producing species to the substrate. Other diamond films under the category of diamond-like carbon (DLC) consist of a mixture of sp2 and sp3 bonds with the higher quality DLC films having higher percentage of sp3 bonds. Many methods for depositing DLC have been demonstrated, including radio frequency plasma deposition, ion beam sputter deposition from a carbon target, ion beam sputtered carbon with ion beam assist, direct ion beam deposition, dual ion beam deposition, laser ablation deposition from a carbon target, and ion beam assisted evaporation of carbon [Ref: U.S. Pat. No. 5,635,245].

The use of diamond films produced by CVD processes in a decorative application and use of DLC coatings on gem media are further described in patent applications 2006/0182883 and 2003/0224167. Additionally the prior art includes various references to the application of DLC coatings to various media such as glass or polymeric materials with a view to improve the wear resistant characteristics or to assist in the preservation of sharp edges (Ref: U.S. Pat. Nos. 6,277,480, 5,795,648, 6,312,808, 5,635,245, 6,338,901, 6,335,086, 5,190,807 and 5,879,775). The growth of synthetic diamond films using high temperature CVD processes on various substrates is limited by the ability of the substrate to withstand high temperatures that are typically employed.

There are a multitude of non-diamond gemstones both natural and synthetic in origin, which are colored naturally or by means of a color enhancing treatment (Ref: Publication No. 20060182883), or clear, that can benefit from having a thin film diamond coating provided to the surface of the faceted and polished gemstones all around. There are various other substrates which serve a commercial application such as glass windows, a utility and or decorative application such as eyeglasses and/or eyeglass frames, metal decorative objects or substrates or jewelry objects, watch dials and/or watch glass and watch bands that would benefit from the application of a thin film of nano-crystalline diamond film. Many of the substrates mentioned here such as natural clear or colored non-diamond gemstones as well as color enhanced gemstones cannot be exposed to high temperatures for growth of synthetic diamond film using CVD techniques because these materials may crack or fracture and/or change color.

The physical characteristics that are generally accepted as being most important to gemstones are hardness, refractive index, color, thermal stability, chemical stability and toughness. Hardness defines the ability of a gemstone to resist scratching. Diamond is the hardest mineral with all other gemstone materials ranking in lower hardness such as sapphire at 9 on the Mohs scale down to precious as well as semi-precious gemstones such as emerald at 7.5, topaz at 8, apatite at 5 etc. Diamond, in addition its superior hardness, also possesses a very high refractive index which results in diamonds having a high brilliance.

Cubic Zirconia (CZ), the cubic crystalline form of Zirconium dioxide is a mineral that is widely synthesized for use as a diamond simulant. CZ has a high dispersive power as compared to diamond (0.06 vs. 0.044 of diamond) which results in increased prismatic fire in CZ that can be readily distinguished from diamond even by the untrained eye. CZ has a lower hardness at 8.5 vs. the 10 rating for diamond, as well as a lower refractive index than diamond. Due to CZs optical closeness to diamond including a high hardness, it has become a very popular low cost diamond simulant and is consumed in large quantities in the production of low cost jewelry.

In recent years manufacturers have sought ways to distinguish their product by supposedly "improving" CZ. Coating finished CZs with a film of DLC has been used where the resulting material is thought to provide an appearance that is more diamond-like overall by supposedly quenching the excess fire of CZ. The improvement in visual characteristics via DLC coating of CZ is subjective. The quality of DLC coatings and their ability to adhere to CZ is entirely dependent on the deposition process employed. DLC films appear colorless only in very thin layers which is another issue that has to be dealt with when coating on colorless CZ.

Yet another field in which gem media have been treated to improve their physical characteristics is in the area of fracture filling or clarity enhancement of such gem media. Examples include fracture filling of diamonds and emeralds. The filling materials that are used for diamonds are commonly of glass origin and, in the case of emeralds, the fillings may be of various types such as oils or polymers.

The filling of surface-reaching breaks in emeralds is a relatively common practice, for which various kinds of oils and a natural resin have historically been used. Now, however, epoxy resins are replacing the more traditional fillers such as cedar-wood oil and Canada balsam. The most widely known of these epoxy resins is sold under the brand name Opticon. The results of a broad study by GIA, of various fracture-filling materials found that Opticon treatment. (1) was, like the traditional materials, best detected using magnification with a variety of lighting techniques, and (2) although somewhat more durable than the traditional enhancements, was still altered in the course of routine jewelry cleaning and manufacturing processes. [Ref: Fracture Filling of Emeralds: Opticon and Traditional "Oils", Gems And Gemmology, Volume 27, Number 2, Robert C. Kammerling, John I. Koivula, Robert E. Kane, Patricia Maddison, James E. Shigley, and Emmanuel Fritsch].

The first commercially available diamond fracture-filling treatment was developed in Israel in the mid 1980s. There are currently three main producers of the fracture filling treatment of diamonds and all three used proprietary formulations of a glass-like compound to fill-in the fractures that are opened to the surface by laser drilling operations. The refractive index of the filling compound is slightly less than diamond and the treatment can be easily distinguished by a color flash that can be observed in the filled regions when viewed at an angle. Also the fillings can be easily removed when the diamond is exposed to temperature above 150 C or if the diamond is exposed to acids which readily attack the glass-like filling.

SUMMARY OF THE INVENTION

The invention solves many of the above problems. An embodiment of the invention includes application of a nano-crystalline diamond coating to a gem material or utility or decorative object by treatment with a slurry of crystalline diamond particles without the use of harsh chemicals or elevated temperatures. The invention avoids the use of methane, hydrogen and carbon monoxide and can be accomplished at reaction temperatures of from room temperature to 200 C as compared to the prior art in which reaction temperatures of above 900 C are commonly utilized.

The invention further includes treatment with a seed slurry composed of sub-10 nm diamond particles applied to the gem material substrate such that the Nanodiamond particles adhere to the substrate via van der Waal's forces. A highly adherent layer of nanodiamond particles coating the substrate results.

In accordance with an example embodiment of the invention, the highly adherent layer of nanodiamond particles on the gem material or decorative object is further stabilized by deposition of an optically transparent layer of DLC or layer of nitrides, oxides or oxynitrides of various transition metals, or a combination thereof. The DLC layer can be applied by known techniques.

In accordance with an embodiment of the invention, the nano-crystalline diamond layer may be applied on a faceted cubic zirconia gem material and further stabilized with a layer of optically transparent DLC or layer of nitrides or oxides, oxynitrides of various transition metals, or a combination thereof such that the resulting optical characteristics closely mimic the appearance of natural diamond. The application of the thin layer of diamond material having diamond's higher refractive index creates a more diamond like appearance in part by reduction of white flash typically seen in CZ due to high dispersion. The diamond coating also leads to improvement in the preservation of facet edges due to the nanodiamond coating which provides abrasion resistance and finally providing protection from UV radiation that generally degrades the color of the CZ over time.

In another embodiment of the invention, a thin film of nanocrystalline diamond is grown all around a cubic zirconia gem using a CVD technique such as hot filament CVD diamond deposition technique in order to render the cubic zirconia with a skin of crystalline diamond having a particular color appearance. The technique of CVD diamond growth or hot filament CVD diamond deposition is known in the prior art, but the application of such processes to grow a diamond skin around a gem material to render it with certain optical properties, is not discussed in the prior art.

In another embodiment of the invention nanocrystalline diamond particles are applied as the filler media which is used to perform fracture filling of natural diamonds or other non-diamond gemstones.

The invention, in one embodiment, describes a process to produce a nano-crystalline diamond film on various substrates including non-diamond natural and synthetic gem materials. The substrates include those that are naturally colored or color enhanced via treatments, or clear. The invention may be applied to other decorative objects such as glass or polymer substrates used in commercial applications or as decorative objects, metal jewelry, metal decorative objects, eyeglasses, and eyeglass frames, watch articles such as the casing, crystal, glass, dial, strap etc. In one embodiment of the invention, the nanocrystaline diamond coating is applied to faceted cubic zirconia to improve the physical characteristics of the substrate to make it appear more diamond like and to improve its physical qualities in the areas of, for example, abrasion resistance.

The term "Nanodiamond" is broadly used herein to describe a variety of diamond based materials at the nanoscale including but not limited to purephase diamond films, diamond particles and their structural assemblies.

Nanodiamond particles can be synthesized using various techniques such as detonation synthesis or chemical vapor deposition processes. [4. Ultrananocrystalline Diamond: Synthesis, properties and Applications, edited by D. Gruen, A. Vul and O. Shenderova, NATO Science Series, Kluwer Acad. Publ., 2005]

Nanodiamond particles are available commercially in powder form or dispersed in oils, solvents or water. The diamond purity and surface chemistry of the nanodiamond particles in various dispersion media vary from vendor to vendor.

In one embodiment, the invention uses commercially available Nanodiamond powders suspended in appropriate dispersion media. The synthesis of the nanodiamond particles can be accomplished by various techniques that are known in the prior art. Nanodiamond synthesis was discovered in the USSR three times over 19 years: first by K. V. Volkov, V. V. Danilenko, and V. I. Elin at the VNIITF (Snezhinsk) in 1963 and then, in 1982, by A. M. Stayer and A. I. Lyamkin at the Institute of Hydrodynamics, Siberian Division, Academy of Sciences of the USSR (Novosibirsk), and by G. I. Savvakin at the Institute of Problems of Materials Science, Academy of Sciences of the UkSSR (Kiev). All of these researchers discovered nanodiamond synthesis accidentally while studying diamond synthesis by shock compression of nondiamond carbon modifications in blast chambers.

One class of nanodiamond material in which the characteristic size of the basic diamond constituents encompassing the range of just a few nanometers. Within this class of materials, nanodiamond synthesized from carbon contained in the molecules of explosives by detonation of the explosive is called detonation nanodiamond (DND). [Ref:Dolmatov, V. Y., Detonation synthesis ultradispersed diamonds: properties and applications, *Russian Chemical Reviews*, 70, 607, 2001]. Detonation nanodiamond is one source of nanodiamond that can be used in the procedures of the present invention.

DND materials possess different degrees of diamond purity depending on the method of purification of the detonation soot obtained after the explosion.

DETAILED DESCRIPTION

Figure 1:
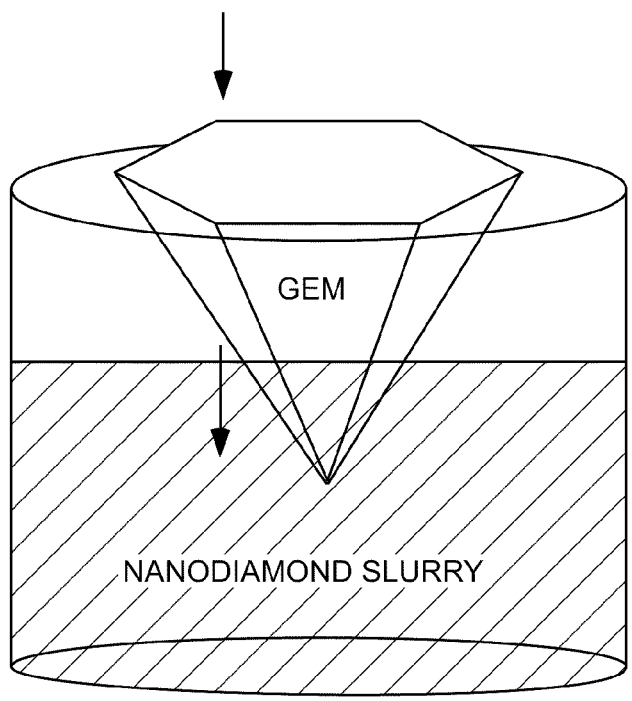
FIG. 1 is a schematic view of a faceted gem being immersed in a nanodiamond slurry in accordance with the present invention.
Figure 2:
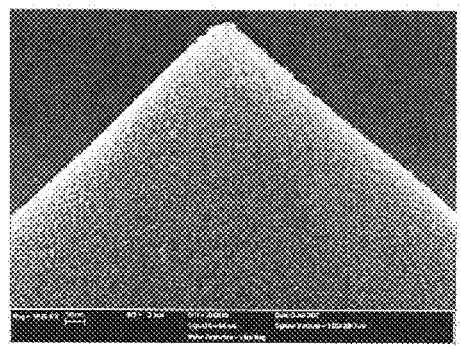
FIG. 2 is a micrograph view of gemstone pavilion facets which have been coated with a nanodiamond slurry.
Figure 3:
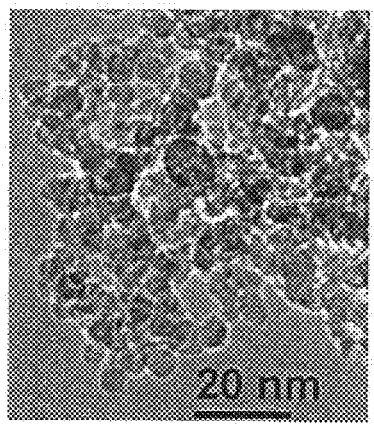
FIG. 3 is a high resolution transmission electron micrograph of nanodiamond clusters in accordance with the invention.
Figure 4:
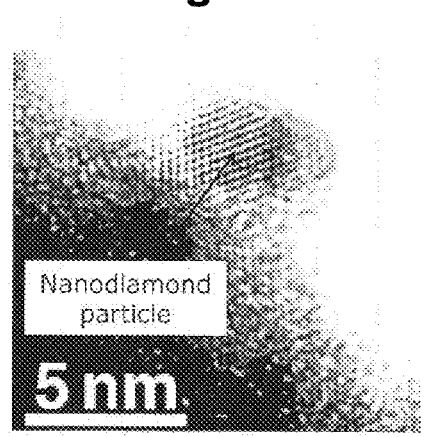
FIG. 4 is a lattice image of a nanodiamond particle in accordance with the invention.
Figure 5:
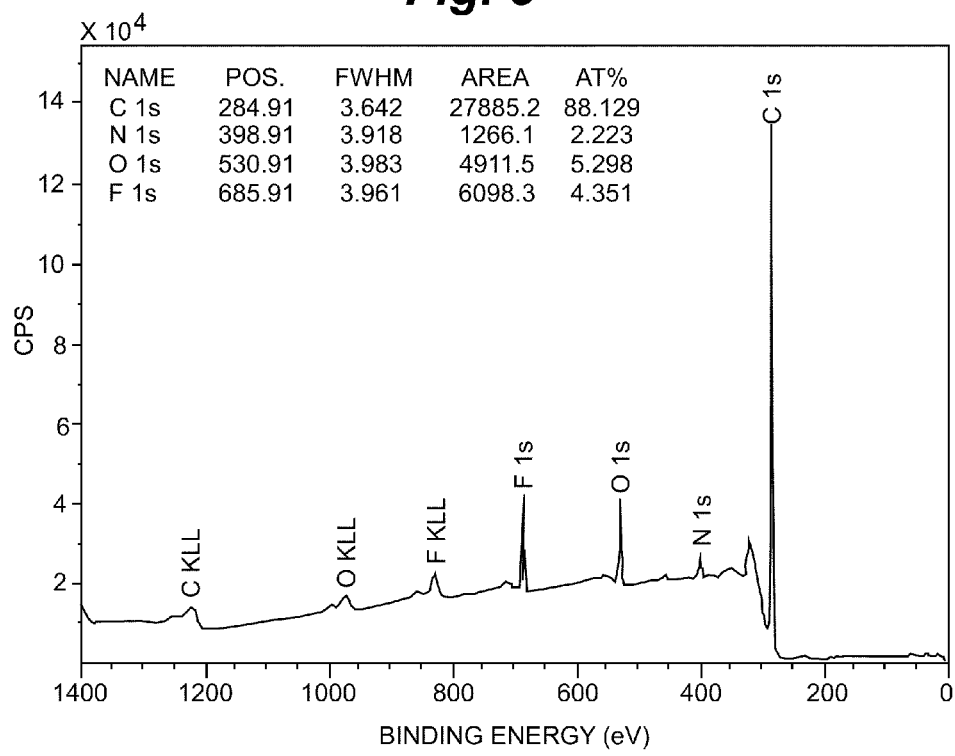
FIG. 5 is a graph of XPS data on nanodiamond.

The procedure outlined below provides the step-by-step method to produce the nano-crystalline diamond coating according to one embodiment of the invention:

1. Commercially obtained nanodiamond powders are used to prepare a slurry in a solvent media such as dimethyl sulfoxide (DMSO), ethanol or preparation of functionalized nanodiamond with improved solubility in polar organic solvents such as alcohols or tetrahydrofuran (THF). Functionalized nanodiamonds are prepared by its reactions with alkylithium reagents, diamines and amino acids. [Functionalization of Nanoscale Diamond Powder: Fluoro-, Alkyl-, Amino-, and Amino Acid-Nanodiamond Derivatives, Yu Liu, Zhenning Gu, John L. Margrave, † and Valery N. Khabashesku* Chem. Mater., 2004, 16 (20), pp 3924-393. The choice of nanodiamond powder is based upon the size of nanodiamond particle desired in the nanodiamond coating and varies from 5-20 nm sized powders to several 100 nm sized powders. In one embodiment of the invention, powders containing nanodiamond less than 100 nm in size are used for the nanodiamond coating.
2. A mixture of Nanodiamond slurry with methanol (or ethanol or IPA) as diluents is prepared.
3. The substrate intended for nano-crystalline diamond coating is immersed in the mixture (FIG. 1).
4. Sonication is performed in a regular sonic bath for a duration that is optimized via experimentation for various substrates. In the case of sonication of faceted gems in the nanodiamond slurry the sonication time is typically 10-30 minutes. The duration of the sonication is derived experimentally by performing the sonication of the object to be coated with nanodiamond for various durations and examining the objects using analytical techniques such as electron microscopy. A sonic bath is a piece of industrial or laboratory equipment that includes a container, or bath, used for cleaning, or mixing things inserted into the bath, by application of ultrasonic vibrations through the liquid in the bath. There are several commercially available ultrasonic bath systems which vary in their ability to apply ultrasonic energy by ultrasound frequency (15-400 kHz).
5. Remove the substrate from the mixture and quickly rinse with solvent to avoid formation of big agglomerates.
6. After rinsing with solvent the treated substrate is dried with nitrogen flow or the flow of another inert gas. The resulting coating consists of highly adherent Nanodiamond particles that are held in place by van der Waal's forces. FIG. 2 depicts micrographs of nanocrystalline diamond particles using high resolution transmission electron microscopy (HRTEM). FIG. 5 depicts X-ray photoelectron spectroscopy (XPS) data of nanodiamond material.
7. The nano-crystalline diamond coated substrate is placed under vacuum in an ion-assisted plasma deposition system such as that depicted in FIG. 6.
8. A thin optically transparent film of DLC is deposited on the nano-crystalline diamond coated substrate to further stabilize the highly adherent layer. The deposition parameters are chosen so as to allow an optimum thickness of DLC film containing high percentage of sp3 bonds and optical transparency to be deposited. Optimum thickness in one example embodiment is about thirty nanometers. Alternatively, the nanocrystalline diamond coated substrate may be stabilized with deposition of an oxide or nitride of various metallic or non-metallic species using the ion-assisted plasma deposition system depicted in FIG. 4. Oxides, Nitrides and/or Oxy-nitrides may be chosen from any of the series of transition metals and may be selected from a group of metals including but not limited to Zinc, Titanium, Titanium-Aluminum, Silicon, Yttrium, Silver, Platinum, Gold, Zirconium or Tantalum. These coatings may be used in conjunction with the deposition of a DLC coating or used without the DLC coating.

Diamond-like-carbon (DLC) coatings are formed when ionized and decomposed carbon or hydrocarbon species land on the surface of a substrate with energy typically 10-300 eV. DLC films may possess exceptional mechanical, optical, electrical, chemical and tribological properties and can be deposited at low substrate temperature (<200° C.). DLC film properties include high hardness, high optical band gap and high electrical resistivity. They generally are inert and demonstrate low friction and wear coefficients.

Such films are generally amorphous (i.e have no dominant crystalline lattice structure) and consist of a mixture of sp2 (trigonal structuring—graphite) & sp3 (tetrahedral structuring—diamond) phases. The sp3/sp2 ratio of the DLC film is controlled by the conditions of the deposition including but not limited to the chamber pressure, gas flow rate, and voltage.

In another example embodiment to create nanocrystalline diamond coating on a gem or other media the following procedure can be followed:

1. A Nanodiamond slurry is prepared by dispersing nanodiamond particles in a solgel media. The composition of the solgel media is optimized according to the substrate to be coated. In an example embodiment of the invention solgels in oxides of Zinc, Titanium, Silicon, or Aluminum is used to create a composite film of nanodiamond particles.
2. The substrate intended for nanocrystalline diamond coating is immersed in the Nanodiamond solgel for a duration that is optimized by experimentation for various substrates according to the desired density of the composite film, adhesion to the substrate material, and desired appearance.

3. The substrate is removed from the Nanodiamond solgel and dried with nitrogen flow or the flow of another inert gas. The composition of the Solgel media is optimized to achieve curing via volatilization of the organic component via a low temperature (<150 C) or room temperature cure.
4. The resulting coating consists of a matrix of Nanodiamond particles dispersed in the solgel media that adheres to the substrate.

The solgel based nano-crystalline diamond slurry as described above can be used on objects such as jewelry eyewear or other decorative objects to provide protection from oxidation, corrosion and/or abrasion and additionally, in some cases, can be used to impart color to the object or to provide the coated object with the ability to block UV radiation.

Figure 6:
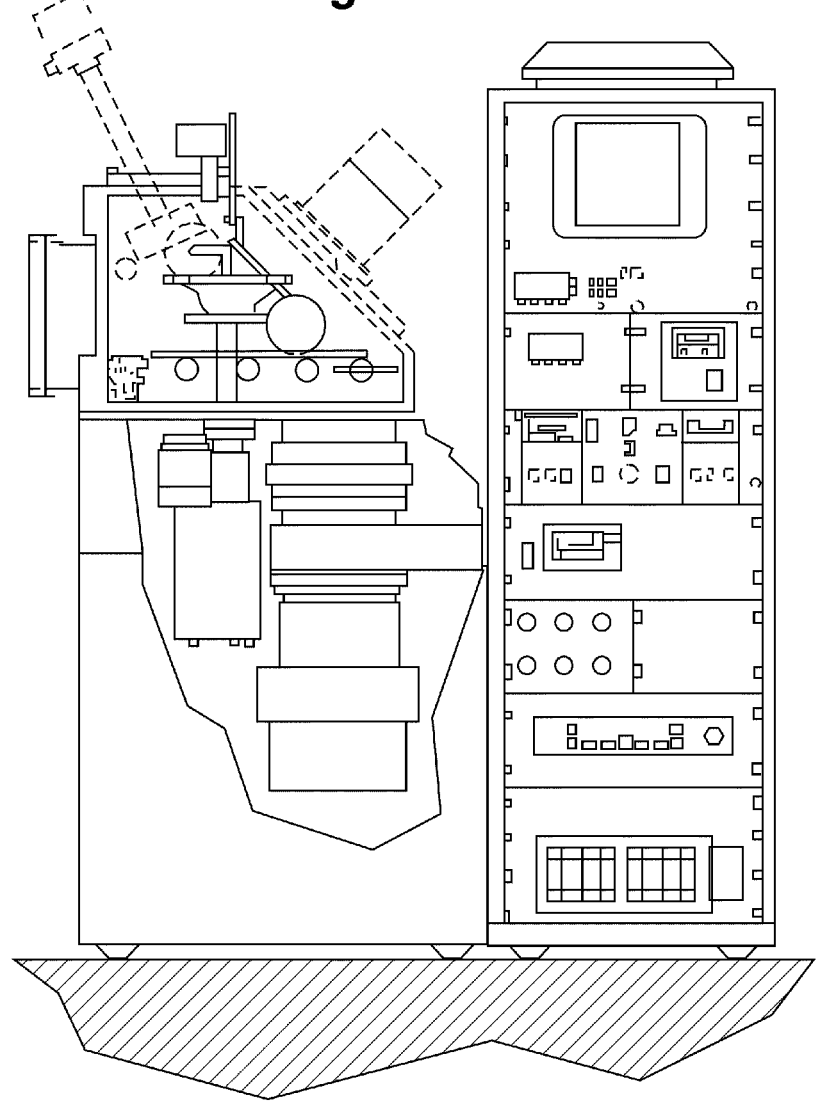
FIG. 6 is a schematic view of a plasma ion-assisted deposition system used for depositing an optically transparent high quality DLC on various substrates layer of oxides, nitrides, oxynitrides of various transition metals or a combination thereof.
Figure 7:
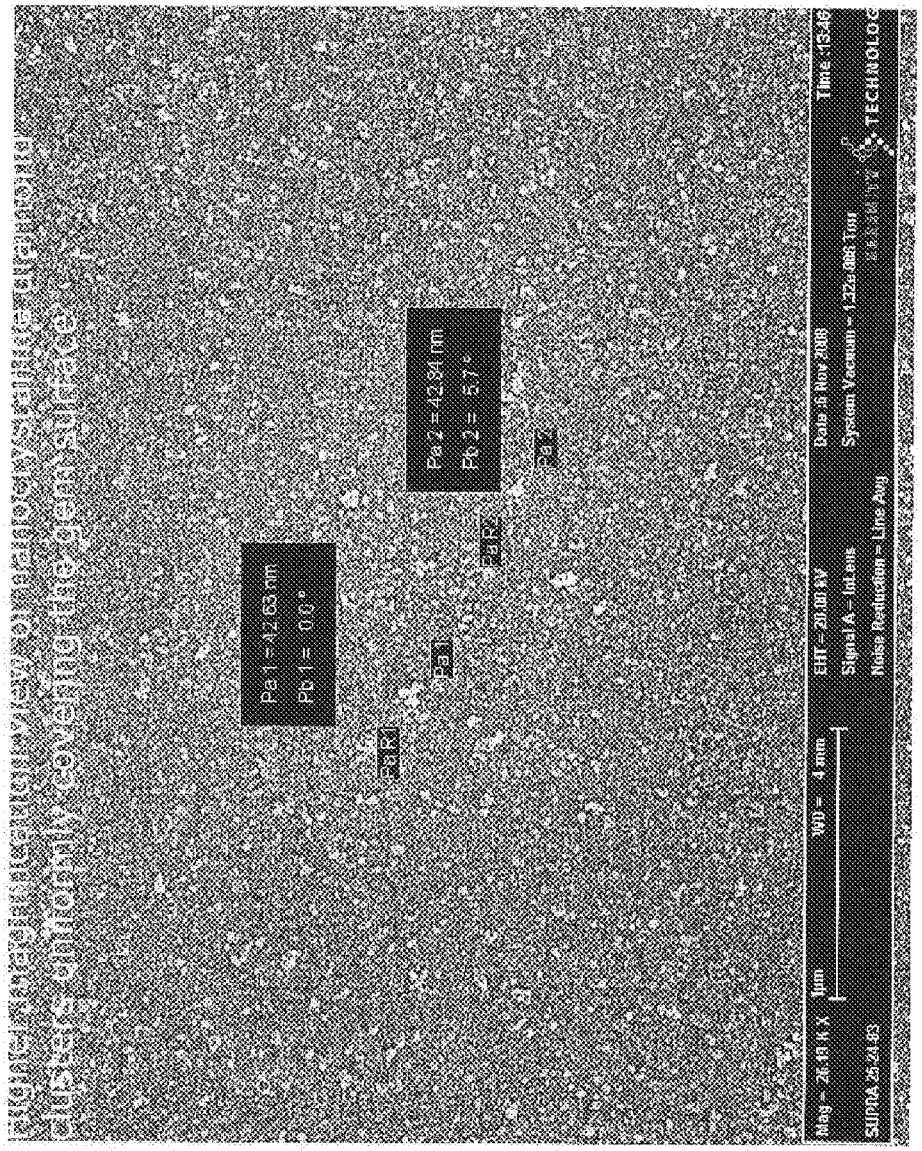
FIG. 7 is a scanning electron microscope image of nanodiamond coating on a gem surface.
Figure 8:
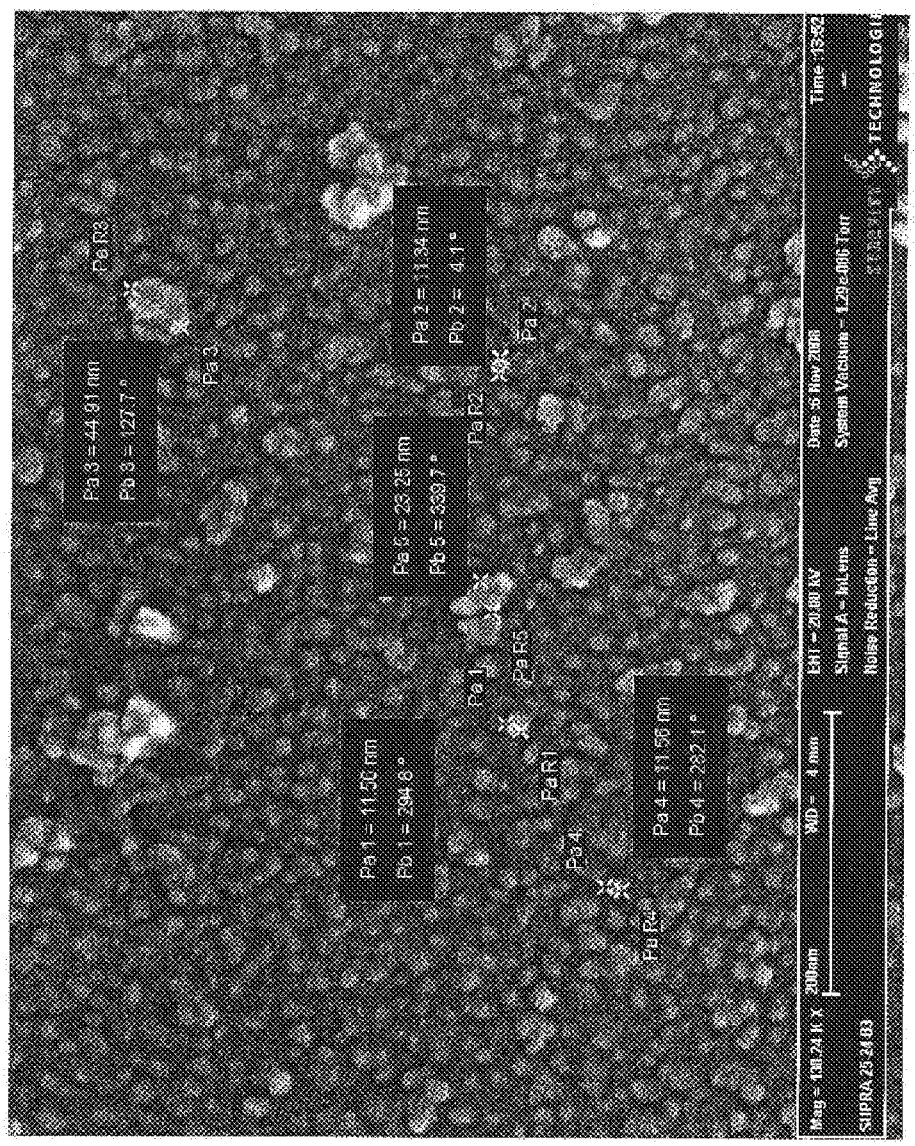
FIG. 8 is a high magnification scanning electron microscope image of a gem surface coated with nanodiamond film.
Figure 9:
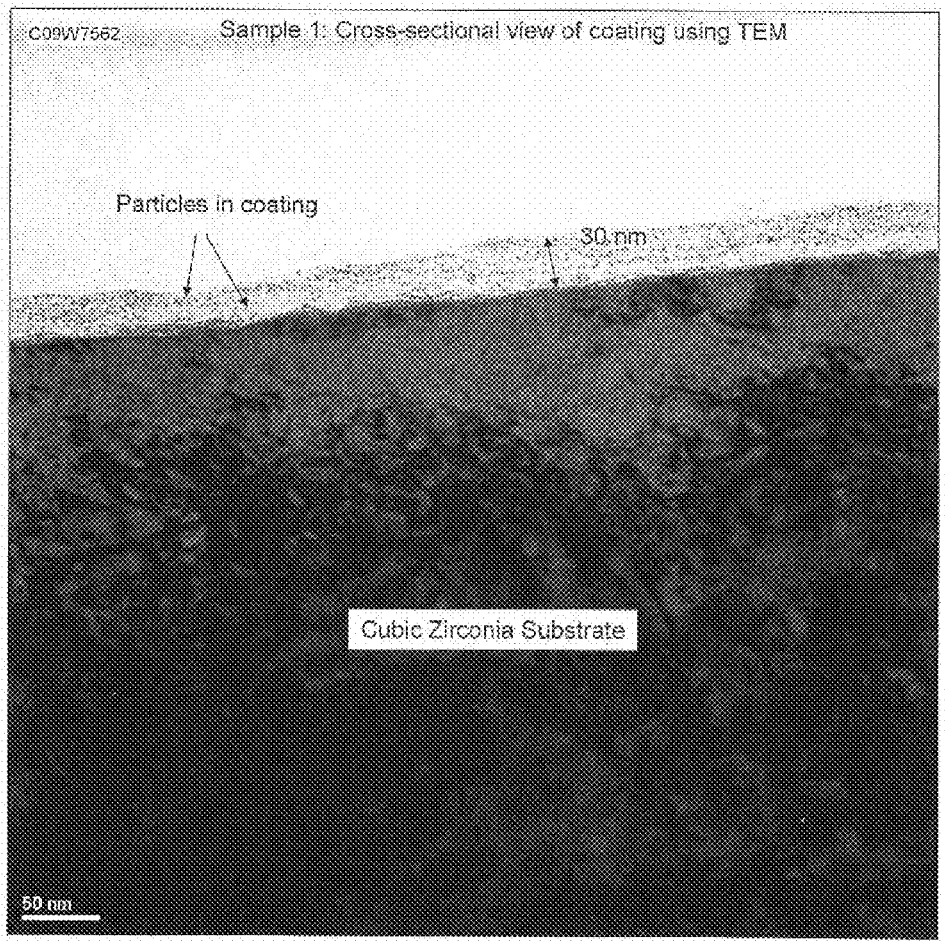
FIG. 9 is a transmission electron microscope cross sectional view of a nanodiamond coating on a gem surface.
Figure 10:
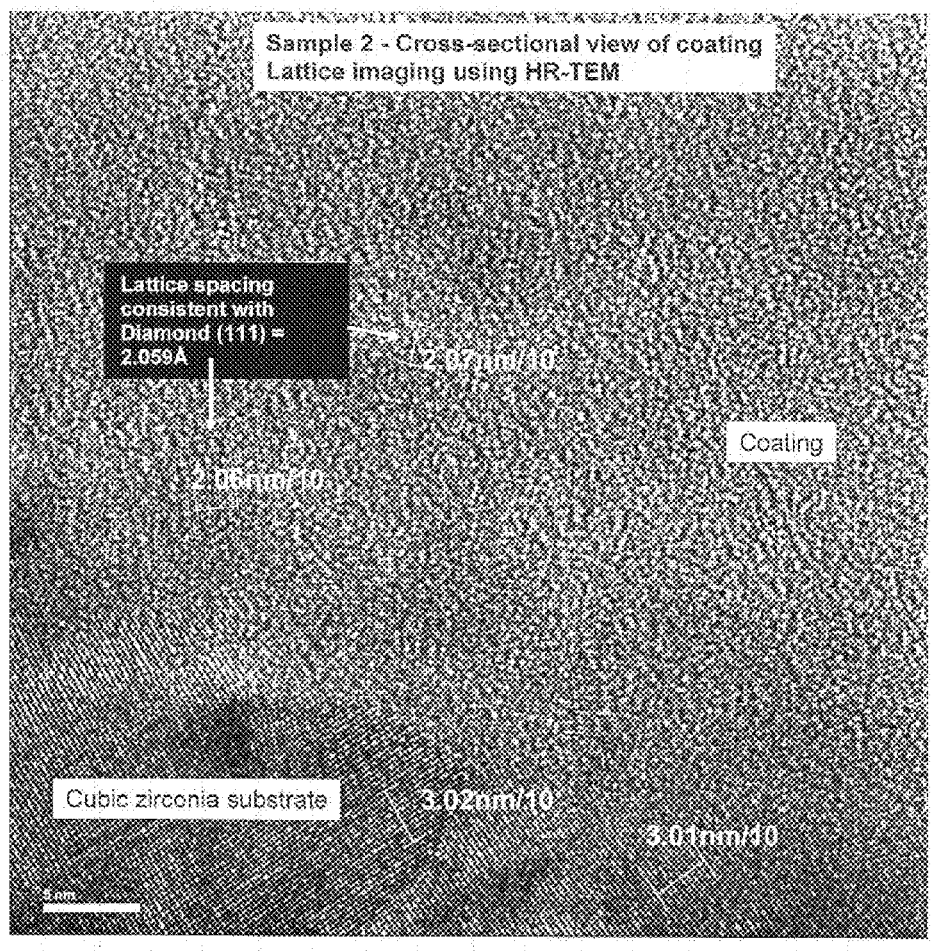
FIG. 10 is a high resolution image of nanodiamond particles with a lattice spacing consistent with diamond coating on a gem surface.
Figure 11:
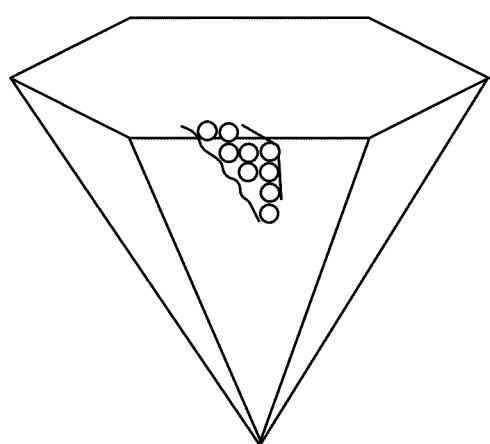
FIG. 11 is a schematic view of a diamond that has been filled with nanocrystalline diamond particles in accordance with the invention.

The procedure outlined below provides a step-by-step method to produce the nanocrystalline diamond coating according to another embodiment of the invention:

1. Prepare a mixture of Nanodiamond slurry with, for example, methanol (or ethanol or isopropyl alcohol) as diluent. The nanodiamond slurry consists of nanodiamond particle such as DND particles dispersed in water based or solvent based media. Solvent based media may include other organic solvents. It is helpful if the slurry is prepared so that the nanodiamond particles remain in suspension for the duration of the procedure.
2. Immerse the substrate intended for nanocrystalline diamond coating into the nanodiamond slurry mixture (FIG. 1).
3. Perform sonication in a regular sonic bath for a duration that can be optimized via experimentation for various substrates. Sonication may be accomplished by placing a vessel containing the substrate and nanodiamond slurry contained in a vessel into a water bath in an ultrasound unit.
4. Remove the substrate from the mixture and quickly rinse with solvent to avoid formation of big agglomerates. Acetone and isopropanol can be used in sequence for this purpose.
5. After rinsing with solvent dry with a flow of inert gas such as nitrogen. The drying can also be accomplished with another inert gas such as argon. The resulting coating consists of highly adherent nanodiamond particles that are held in place by van der Waal's forces. FIGS. 2, 2a and 2b depict micrographs of the nanocrystalline diamond particles using high resolution transmission electron microscopy (HRTEM). FIG. 5 shows X-ray photoelectron spectroscopy (XPS) data of DND material.
6. The nano-crystalline diamond coated substrate is placed under vacuum in an ion-assisted plasma deposition system (FIG. 6). An example appropriate ion-assisted plasma deposition system is described in a U.S. Published Patent Application 2006/0182883 the contents of which are incorporated by reference herein.
7. A thin optically transparent film of, for example DLC or zinc oxide is deposited on the nano-crystalline diamond coated substrate to further stabilize the highly adherent layer. The deposition parameters are chosen so as to allow an optimum thickness of DLC film containing high percentage of sp3 bonds and optical transparency to be deposited. A high percentage of sp3 bonds in this context may be about seventy percent but may vary depending on the application. Generally, a higher concentration of sp3 bonds leads to a harder coating but a higher percentage of sp3 bonds may interfere with optical transparency or clarity. Alternatively, the nanocrystalline diamond coated substrate may be stabilized with deposition of an oxide, nitride or various metallic or non-metallic species using the ion-assisted plasma deposition system shown in FIG. 6. Example Oxides include but are not limited to e.g. $SiO_2$, $TiO_2$, $Al_2O_3$, $V_2O_3$, $Fe_2O_3$, $Cr_2O_3$, NiO, $Ta_2O_5$. Example Nitrides include but are not limited to e.g., $TiN_x$, ZrN, TaN, Examples of other coating species include but are not limited to TiZrN, TiCN, $TiC_xN_y$, $ZrC_xN_y$, Au, Ag and Cu.

Procedure to create nano-crystalline diamond coating on a gem or other media in another embodiment of the invention:

1. The Nanodiamond slurry is prepared by dispersing DND particles in a sol-gel media. The composition of the sol-gel media is optimized according to the substrate to be coated.
2. Immerse the substrate intended for nano-crystalline diamond coating in the Nanodiamond sol-gel for a duration that is optimized by experimentation for various substrates.
3. Remove substrate from Nanodiamond sol-gel and dry with nitrogen flow or a flow of another inert gas. The composition of the sol-gel media is optimized to achieve curing via volatilization of the organic component via a low temperature or room temperature cure. This can be done by the use of organic solvents that are volatile at room temperature.
4. The resulting coating consists of a matrix of Nanodiamond particles dispersed in the sol-gel media that adheres to the substrate.

The sol-gel based nanocrystalline diamond slurry as described above can be used on objects such as jewelry eyewear, watches or other decorative objects to provide protection from oxidation, corrosion and/or abrasion and, additionally in some cases, be use to impart color to the object or provide the coated object with the ability to block UV radiation.

Example procedure for fracture filling of diamonds with Nanodiamond in another embodiment of the invention:

1. The Nanodiamond slurry is prepared by dispersing DND particles in a chemically functionalized carrier media. The carrier media has a volatile component which easily evaporates at room temperature or elevated temperature and atmospheric pressure leaving behind an inorganic compound of oxide origin. The carrier media can be chemically functionalized in that components of the media may be chemically reactive in the formation of the fracture filling or in that portions of the media remain as part of the coating or filling.
2. Pre-clean the diamond (containing fractures that are open to the surface) with solvents including alcohol, acetone, sulfuric acid, hydrogen peroxide, and/or water, to remove surface oils, hydrocarbons and other common surface impurities therefrom.
3. Ensure that the fractures in the diamond are open to the surface by performing laser drilling if necessary. Laser drilling may be accomplished by the use of commercially available diamond laser drilling techniques.
4. Perform cleaning in strong caustics and acids with rinses in between. This assists in the removal of any oxides or glassy structures, and/or metallic traces in the diamond. The caustics or acids may include, for example, sodium hydroxide, hydrofluoric acid, nitric acid, sulfuric acid, hydrochloric acid as well as other inorganic acids and alkalis.

5. The cleaned diamond is immersed in the Chemically Functionalized Nanodiamond slurry placed in a pressure chamber maintained above 50 atmospheres. In some applications it may be beneficial to utilize centrifugal force to facilitate filling of the fractures.
6. The diamond is removed from pressure chamber after a duration optimized according to the characteristics of the fractures being filled. The required duration may be affected by the depth, width, volume or shape of the fracture to be filled.
7. The diamond is sonicated in a solvent and dried in a nitrogen flow or the flow of another inert gas (FIG. 5).

In another embodiment of the invention, the following procedure is used.

1. The Nanodiamond slurry is prepared by dispersing nanodiamond particles in an appropriate carrier media such as DMSO which is further diluted using other volatile organics such as methanol, ethanol or THF. The carrier media is volatile in nature and easily evaporates at elevated temperature and atmospheric pressure leaving behind the nanodiamond particles.
2. Pre-clean the diamond (containing fractures that are open to the surface) with solvents including alcohol, acetone, sulfuric acid, hydrogen peroxide, and/or water, to remove surface oils, hydrocarbons and other common surface impurities.
3. Ensure that the fractures in the diamond are open to the surface by performing laser drilling, if necessary.
4. Perform cleaning in strong caustics and acids with rinses in between. This ensures removal of any oxides or glassy structures, and/or metallic traces in the diamond.
5. The cleaned diamond is immersed in the container of Nanodiamond slurry and placed in a pressure chamber maintained above 50 atmospheres. Unlike conventional fracture filling treatments using proprietary formulations of molten glass the diamond does not need to be exposed to elevated temperature.
6. The diamond is removed from pressure chamber after a time period optimized according to the characteristics of the fractures being filled. The fractures that have very little depth into the diamond will fill up with the nanodiamond slurry in a shorter duration (1-4 hrs) and diamonds having fractures that extend deep into the body of the stone may need to remain in the pressure vessel to promote the filling of the fractures for durations greater than 8 hours.
7. The diamond is sonicated in a solvent and dried in a nitrogen flow (FIG. 5).
8. In another embodiment of the invention centrifugal force is used for the filling of the fractures using the hydrostatic force generated and the rotational speed of the system is optimized according to the fill length of the fractures.

An example procedure for filling of fractures and fissures in emerald with sol gel media containing a dispersion of nanodiamond particles is presented below. Emerald has a mineral composition Al2Be3[Si6O18] which comes from a class of aluminosilicates. Unlike the use of foreign materials such as oils or polymers, the filling of fractures in emeralds by materials that have the same or similar composition as the emerald should enable a superior quality filling that will not have the disadvantages of conventional fillings. A sol gel media containing an inorganic component from the class of aluminosilicates close in composition to the emerald mineral, and mixed with a chemically functionalized nanodiamond slurry containing a volatile organic component is chosen.

1. The Nanodiamond Emerald Sol Gel slurry is prepared by dispersing nanodiamond particles in an appropriate carrier media such as DMSO which is further diluted using other volatile organic liquids such as methanol, ethanol or THF and further mixing it with an aluminosilcate sol gel (commercial formulations with composition close to emerald mineral).
2. Pre-clean the emerald (containing fractures that are open to the surface) with solvents including alcohol, acetone to remove surface oils, hydrocarbons and other common surface impurities.
3. Ensure that the fractures in the emerald are open to the surface by performing mechanical drilling or laser drilling, if necessary, and perform cleaning using solvents.
4. The cleaned emerald is immersed in a container containing the Nanodiamond Emerald sol gel slurry and placed in a pressure chamber maintained above 50 atmospheres.
5. The emerald is removed from pressure chamber after a duration optimized according to the characteristics of the fractures being filled. The fractures that have very little depth into the emerald will fill up with the nanodiamond emerald solgel slurry in a shorter duration (1-4 hrs) and emeralds having fractures that extend deep into the body of the stone will need to remain in the pressure vessel to promote the filling of the fractures for durations greater than 8 hours.
6. The emerald is sonicated in a solvent and dried in a nitrogen flow or flow of other inert gas (FIG. 5).
7. In another embodiment of the invention a centrifugal force is used for the filling of the fractures using the hydrostatic force generated and the rotational speed of the system is optimized according to the fill length of the fractures.

In accordance with the invention a sol gel liquid of a composition that is the same or similar to the emerald mineral is mixed with a nanodiamond slurry and when the pressure filling technique of centrifugal or pressure chamber is applied, the slurry moves into the fractures and fissures aided by the movement of the nanodiamond particles. IN this embodiment of the invention, the nanodiamond particles serve the purpose of improving transport properties of the liquid and also help in immobilizing the cured sol after the organic component is volatilized. It is known that nanoparticles dispersed composite materials are strong and adhere well when applied as a coating material.

Fluid filling of microchannels can be done in various methods including but not limited to mechanical pressure (such as the pressure chamber described above), electrical force (electrohydrodynamic flow, electrophoretic flow and electroosmotic flow [1]), surface tension, centrifugal force etc [2].

Ref 1: Fuhr, G.; Schnelle, T.; Wagner, B., "Travelling wave-driven microfabricated electrohydrodynamic pumps for liquids", *Journal of Micromechanics and Microengineering*, 4 (1994): 217-26).

Ref 2: Microfluidics of Complex Fluids, Kai Kang, Ph. D. Dissertation, Ohio State University, 2003.

The resulting fracture filled diamond and/or fracture filled emerald containing nanocrystalline diamond with or without other carrier or solgel media, provide several advantages over existing methods:

1. The refractive index of the diamond filling is the same as the diamond or nearly so if any carrier media or solgel media is used. This should make the filled area undetectable or nearly so.
2. The fracture filled emerald contains the material of same or similar composition as the emerald mineral along with the dispersed nanodiamond particles. This renders the filled fractures undetectable or nearly so, additionally provides superior mechanical and thermal stability to the gem rendering it the ability to be set in jewelry employing various methods such as wax setting which typically is not done for emeralds. Emeralds by themselves can withstand elevated temperatures encountered in some jewelry setting operations such as wax setting, but the fillings such as oils, resins and polymers used to fill fissures and cracks cannot withstand elevated temperatures and thus emerald is always hand set very carefully. The method disclosed in this invention wherein the emerald is filled with a material of the same or similar composition as the mineral itself and further stabilized by the dispersion of nanodiamond particles provides new abilities for this gem to withstand environments of jewelry setting as well as end user handling that typically cannot be done by emeralds that are filled using conventional foreign materials. This process allows the emerald to be healed of its fractures and fissures rather than just filled.

3. The fillings in diamond or emerald cannot be removed by exposure to acids or caustics or solvents unlike conventional glass fillings for diamonds that can be attached by acids and caustics as well as conventional fillings for emeralds which can be removed by solvents or steam.

4. The nanocrystalline diamond filling consists of the agglomerates of the sub-5 nm diamond particles integrated in the carrier matrix and do not have a tendency to migrate once the volatile component of the carrier media has been removed.

A diamond that is to undergo fracture filling using nanocrystalline diamond particles as the filler material, should be inspected to verify if the fractures to be filled reach the surface. If the fractures or other flaws such as inclusions are present in the interior of the stone with no path to the surface then the diamond may undergo the laser drilling process to create an opening or nanotubule to the fracture or inclusion. The laser drilling technique is described in the prior art and is a commercially available process.

The combustibility of diamond has allowed the development of laser drilling techniques which, on a microscopic scale, are able to selectively target and either remove or significantly reduce the visibility of crystal or iron oxide-stained fracture inclusions. Diamonds have been laser-drilled since at least the mid-1980s.

Laser drilling involves the use of an infrared laser (wavelength about 1060 nm) to bore very fine holes (less than 0.2 millimeters or 0.005 inches in diameter) into a diamond to create a route of access to an inclusion. Because diamond is transparent to the wavelength of the laser beam, a coating of amorphous carbon or other energy-absorbent substance is applied to the surface of the diamond to initiate the drilling process. The laser then burns a narrow tube to the inclusion. Once the included crystal has been reached by the drill, the diamond is immersed in sulfuric acid to dissolve the crystal or iron oxide staining. This process is not effective for inclusions which are diamonds themselves, as diamond is not soluble in sulfuric acid).

Several inclusions can be thus removed from the same diamond, and under microscopic inspection the fine bore holes are readily detectable. They are whitish and more or less straight, but may change direction slightly, and are often described as having a "wrinkled" appearance. In reflected light, the surface-reaching holes can be seen as dark circles breaching the diamond's facets. The diamond material removed during the drilling process is destroyed, and is often replaced with glass infilling, using the fracture filling techniques known in the prior art such as the Yehuda Treatment or the Koss process (Ref: Fracture Filling of Diamonds, Janina Skawinska A. G. (C.I.G.), Winnipeg, Man).

If the flaw is an inclusion then after laser drilling procedure the diamonds are deep boiled using acids (sulfuric, nitric, hydrofluoric acids) to remove the impurities or foreign substances that make up the inclusion.

The diamond containing the flaw (fracture or void from which inclusions have been removed) is then cleaned using Acetone and IPA solvent cleaning procedures in a sonic bath and thereafter placed into fixtures or specially designed vessels that contain the nanocrystalline diamond filler media. The nanocrystalline diamond filler media includes nanocrystalline diamond particle clusters suspended in various media including but not limited to distilled water, dimethyl sulfoxide, dimethylformamide, dimethylacetamide, methanol, etc. In one embodiment of the invention, the diamond submerged in the nanocrystalline diamond media containing vessel is placed inside a pressure vessel capable of applying pressures up to 50 atmospheres.

The resulting fracture filled diamond, containing nanocrystalline diamond, provides several advantages over the product of existing methods.

1. The refractive index of the diamond filling is the same as the diamond.
2. The filling cannot be removed by exposure to heat or acids since neither affect the nanocrystalline diamond particles unlike in the case of the glass-like fillings.

The nanocrystalline diamond filling consists of the agglomerates of the sub-5 nm diamond particles integrated in the carrier matrix and do not have a tendency to migrate once the volatile component of the carrier media has been removed.

The sol-gel process is a versatile solution process for making ceramic and glass materials. In general, the sol-gel process involves the transition of a system from a liquid "sol" (mostly colloidal) into a solid "gel" phase. Applying the sol-gel process, it is possible to fabricate ceramic or glass materials in a wide variety of forms: ultra-fine or spherical shaped powders, thin film coatings, ceramic fibers, microporous inorganic membranes, monolithic ceramics and glasses, or extremely porous aerogel materials.

The starting materials used in the preparation of the "sol" are usually inorganic metal salts or metal organic compounds such as metal alkoxides. In a typical sol-gel process, the precursor is subjected to a series of hydrolysis and polymerization reactions to form a colloidal suspension, or a "sol". Further processing of the "sol" enables one to make ceramic materials in different forms. Thin films can be produced on a piece of substrate by spin-coating or dip-coating. When the "sol" is cast into a mold, a wet "gel" will form. With further drying and heat-treatment, the "gel" is converted into dense ceramic or glass articles. If the liquid in a wet "gel" is removed under a supercritical condition, a highly porous and extremely low density material called "aerogel" is obtained. As the viscosity of a "sol" is adjusted into a proper viscosity range, ceramic fibers can be drawn from the "sol". Ultra-fine and uniform ceramic powders are formed by precipitation, spray pyrolysis, or emulsion techniques.

FIGS. 5, 6 7 and 8 provide the data to illustrate the microscopic analysis of a nanodiamond film deposited on a cubic zirconia gem surface using the procedures described in the invention.

The procedure outlined below provides a method in accordance with another embodiment of the invention to produce a nanocrystalline or polycrystalline diamond conformal growth all over a faceted or unfaceted gem material that is capable of withstanding elevated temperature required for diamond deposition using techniques such as hot filament CVD.

1. The gem material such as a faceted cubic zirconia is pre-cleaned with solvents including acetone and isopropyl alcohol (IPA) to remove surface contamination, dirt and oils. Place the cubic zirconia in a system as described by FIG. 6 and deposit a thin seed layer of a materials such as titanium, graphite or silicon carbide (thickness sub-20 nm). This is done to promote the adhesion of the CVD diamond film that is to be grown over the gemstone surface.
2. Load the gem material such as the faceted cubic zirconia or other decorative object onto a flat holder by placing the gemstone table-side down such that the pavilion side of the gem is exposed.
3. Load the holder into a commercially available diamond CVD system.
4. The chamber of the diamond deposition system is evacuated to below 20 mTorr and the reaction gases comprising of methane (CH4) diluted with hydrogen (H2) are flowed into the system. The diamond deposition while using cooling systems to control the temperature of the holder containing the gemstones to below 750 C.
5. The thickness of the diamond film grown on the exposed surface of the gemstone is controlled by the reaction chemistry and duration of the run so that resulting thickness is in the sub-100 nm range. The chemistry of the film is controlled by the sequence of hydrogen etching to remove the non-diamond components of the film.
6. The gemstone is removed from the system after the deposition cycle and then reloaded onto another fixture that allows the stone to be placed with the table side exposed.
7. The process of diamond deposition is again run in the diamond CVD system.

The invention in one embodiment includes depositing a thick layer of hot filament CVD diamond on a material such as titanium or silicon carbide or molybdenum or tantalum to create a black diamond watch dial. The procedure in this embodiment is similar to how the gemstone is coated in the CVD chamber except that the thickness is optimized to be 10-12 microns in order to achieve a black color.

The present invention may be embodied in other specific forms without departing from the spirit of the essential attributes thereof; therefore, the illustrated embodiments should be considered in all respects as illustrative and not restrictive, reference being made to the appended claims rather than to the foregoing description to indicate the scope of the invention.

The invention claimed is:

1. A coated object comprising:
a substrate;
a first coating layer of highly adherent nanodiamond particles held to the substrate by van der Waals force; and
a second transparent coating layer overlying the first coating layer, the second transparent coating layer comprising nanodiamond particles embedded therein, wherein the substrate comprises a gemstone.

2. The coated object of claim 1, wherein the second transparent coating layer comprises diamond like carbon.

3. The coated object of claim 2, wherein the second transparent coating layer comprises an ion assisted plasma deposition.

4. The coated object of claim 2, wherein the highly adherent nanodiamond particles comprise detonation nanodiamond crystals.

5. The coated object of claim 1, wherein the second transparent coating layer comprises a metallic or non-metallic oxide, nitride or oxynitride.

6. The coated object of claim 1, wherein the highly adherent nanodiamond particles are less than one hundred nanometers in size.

7. The coated object of claim 6, wherein the highly adherent nanodiamond particles are less than five nanometers in size.

8. The coated object of claim 1, wherein the substrate comprises a diamond containing at least one fracture open to a surface and wherein the first coating layer at least partially fills the fracture.

9. The coated object of claim 1, wherein the second transparent coating layer comprises a combination of diamond like carbon and a metallic or non-metallic oxide, nitride or oxynitride.

10. The coated object of claim 1, wherein the coated object is a transparent synthetic gem.

* * * * *